US 008064506B2

(12) United States Patent  
Raja et al.

(10) Patent No.: US 8,064,506 B2
(45) Date of Patent: Nov. 22, 2011

(54) SIGNAL GENERATOR AND USER INTERFACE FOR SETTING TEST SEQUENCES AND PARAMETERS OF A TEST SIGNAL

(75) Inventors: Ramasubramaniya Raja, Bangalore (IN); Susan M. Michalak, Portland, OR (US); Susan C. Adam, Portland, OR (US); Kunihiso Jitsuno, Tokyo (JP); Muralidharan A. Karapattu, Bangalore (IN); Iqbal G. Bawa, Bangalore (IN)

(73) Assignee: Tektronix International Sales GmbH, Rheinfall (CH)

( * ) Notice: Subject to any disclaimer, the term of this patent is extended or adjusted under 35 U.S.C. 154(b) by 822 days.

(21) Appl. No.: 12/137,469

(22) Filed: Jun. 11, 2008

(65) Prior Publication Data

US 2008/0313516 A1    Dec. 18, 2008

(51) Int. Cl.
H04B 3/46 (2006.01)
(52) U.S. Cl. ........................ 375/224; 375/227
(58) Field of Classification Search .................. 375/224, 375/227; 714/738
See application file for complete search history.

(56) References Cited

U.S. PATENT DOCUMENTS

| 6,512,989 | B1 * | 1/2003 | Deome et al. | 702/124 |
| 6,515,484 | B1 * | 2/2003 | Bald et al. | 324/551 |
| 6,788,077 | B2 * | 9/2004 | Hamdan | 324/726 |
| 7,512,510 | B2 * | 3/2009 | Kirchner | 702/121 |
| 2005/0107974 | A1 * | 5/2005 | Tseng | 702/113 |

* cited by examiner

Primary Examiner — Hassan Kizou
Assistant Examiner — Emmanuel Maglo
(74) Attorney, Agent, or Firm — William K. Bucher

(57) ABSTRACT

A signal generator generates a WiMedia ultra wideband test signal with a user interface for setting test sequences and parameters of the test signal. Parameters are set for Presentation Protocol Data Units associated with Packet Groups of the test signal. A signal processing unit compiles the Groups containing the Presentation Protocol Data units to generate digital data representative of the test signal. A waveform generator receives the digital data and generating a test signal output having Packet Groups containing Presentation Protocol Data Units. A method is describes for setting test sequences and parameters of an ultra wideband test signal test signal with a user interface of the signal generator.

14 Claims, 10 Drawing Sheets

Modulation

Modulation

| | |
|---|---|
| Modulation Type | 2 FSK |
| FSK Index | 0.5000 |
| Coding | None |
| Symbol Rate | 1.152000 MHz |
| Sequence Length | 11520 sym |

Filter / Window

| | |
|---|---|
| Filter Function | Gauss |
| B * T | 0.50 |
| Window Function | Rect |
| Chebyshev Ripple /dB | 0.00 |
| Impulse Length | 32 |
| Oversampling | ☐ Auto    16 |
| Bb. Impulse | ☑ Auto    Rect |

[ OK ]   [ Cancel ]   [ Advanced ]

Figure 2B (PRIOR ART)

Figure 3B

SIGNAL GENERATOR AND USER INTERFACE FOR SETTING TEST SEQUENCES AND PARAMETERS OF A TEST SIGNAL

BACKGROUND OF THE INVENTION

The present invention relates generally to the generation of test signals and more particularly to a signal generator and user interface for setting parameters and test sequences for a test signal generated by the signal generator.

To check the operation of an electrical circuit under test, a test signal is provided to the circuit under test. A signal generator is an apparatus that provides such a test signal for checking the operation of the circuit under test. The signal generator has controls for setting-up the test signal according to user settings. The output signal from the electrical circuit may be observed by a measurement instrument, such as an oscilloscope or the like.

Various manufacturers provide user interfaces for setting-up test signals. One Example is the WinIQSIM™ Simulation Software, manufactured and sold by Rohde & Schwarz. The simulation software provides a user interface for setting-up digitally modulated signals and adding impairments to the signals. The user interface has a multi-carrier block diagram as shown in FIG. 1A having various blocks for defining parameters and setting impairments to the signal. Clicking on one of the blocks, such as the Data Source block, opens a data source dialog window as shown in FIG. 1B where the user can define data parameters or import a data file. Once the user has set the parameters of the data source, the user clicks the OK box and the dialog box closes. Clicking on the Modulation Setting block as shown in FIG. 2A opens a Modulation dialog window as shown in FIG. 2B where the user can set the modulation parameters of the signal. Clicking on the OK box closes the Modulation Setting dialog window. Clicking on the IQ Impairment block as shown in FIG. 3A opens an IQ Impairment dialog window as shown in FIG. 3B where the user can set the IQ Impairments "On" and set IQ impairments for the signal. Clicking on the OK box closes the IQ Impairment dialog window.

A drawback to the above described user interface is that the user has to set signal parameters with the respective dialog windows for each of the blocks in the block diagram. This does not allow the user to view all of the settings for the signal at a glance. Further, the above user interface does not allow the setting of a group of PPDUs (Presentation Protocol Data Units) and the repeating of the group(s). Neither does the above described user interface provide for selective ON/OFF of signal components, such as headers and Physical layer Service Data Unit (PSDU).

What is needed is a user interface for use with a signal generator that allows a user to view the settings of a signal at a glance. The user should be able to set parameters for signal packets and groups of packets. The user interface should allow sequence control of the groups to allow the signal generator to provide various and complicated frame sequences and provide structured test approaches to design development processes.

SUMMARY OF THE INVENTION

The present invention is a signal generator and method for setting test sequences and parameters of a test signal. The signal generator has a user interface for selecting parameters in one or more Presentation Protocol Data Units associated with one or more Packet Groups for the test signal. A signal processing unit compiles the Packet Group or Groups containing the Presentation Protocol Data Unit or Units to generate digital data representative of the test signal. A waveform generator receives the digital data and generates a test signal output. A memory stores the compiled digital data representative of the test.

The method of setting test sequences and parameters of a test signal has the steps of defining a Packet Group and an indexed Presentation Protocol Data Unit. A presentation Protocol Data Unit element is selected in the indexed Presentation Protocol Data Unit, a component is selected within the selected Presentation Protocol Data Unit element, and parameters are input for detailed setting items in the selected component within the selected Presentation Protocol Data Unit element. The indexed Presentation Protocol Data Unit is processed and associated with the Packet Group. The processed Packet Group is compiled to generate digital data representative of said test signal. A test signal output is generated that is defined by the parameters in the indexed Presentation Protocol Data Unit associated with the Packet Group. Additional indexed Presentation Protocol Data Units may be defined and parameters input and associated with additionally defined Packet Groups. The Packet Groups may be repeated a number of time by selecting a repeat number. An initial step allows for selecting a conformance operational mode or a custom operational mode.

The objects, advantages and other novel features of the present invention are apparent from the following detailed description when read in conjunction with the appended claims and attached drawings.

BRIEF DESCRIPTION OF THE DRAWINGS

FIG. 2B is a Modulation Setting dialog window called using the Multi carrier block diagram.

Figure 3B:
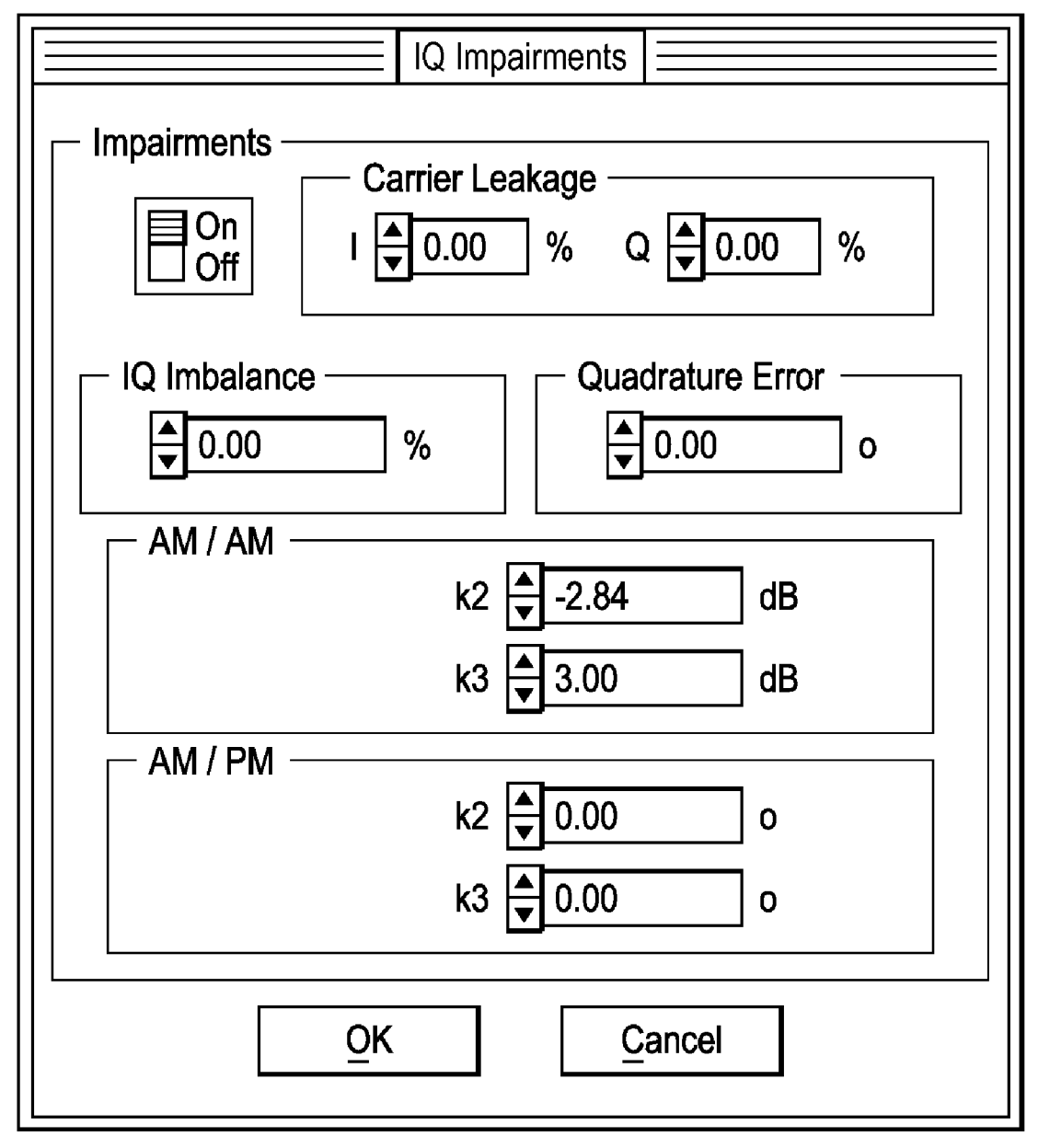

FIG. 3B is an IQ Impairments dialog window called using the Multi carrier block diagram.

DESCRIPTION OF THE INVENTION

Figure 1A:
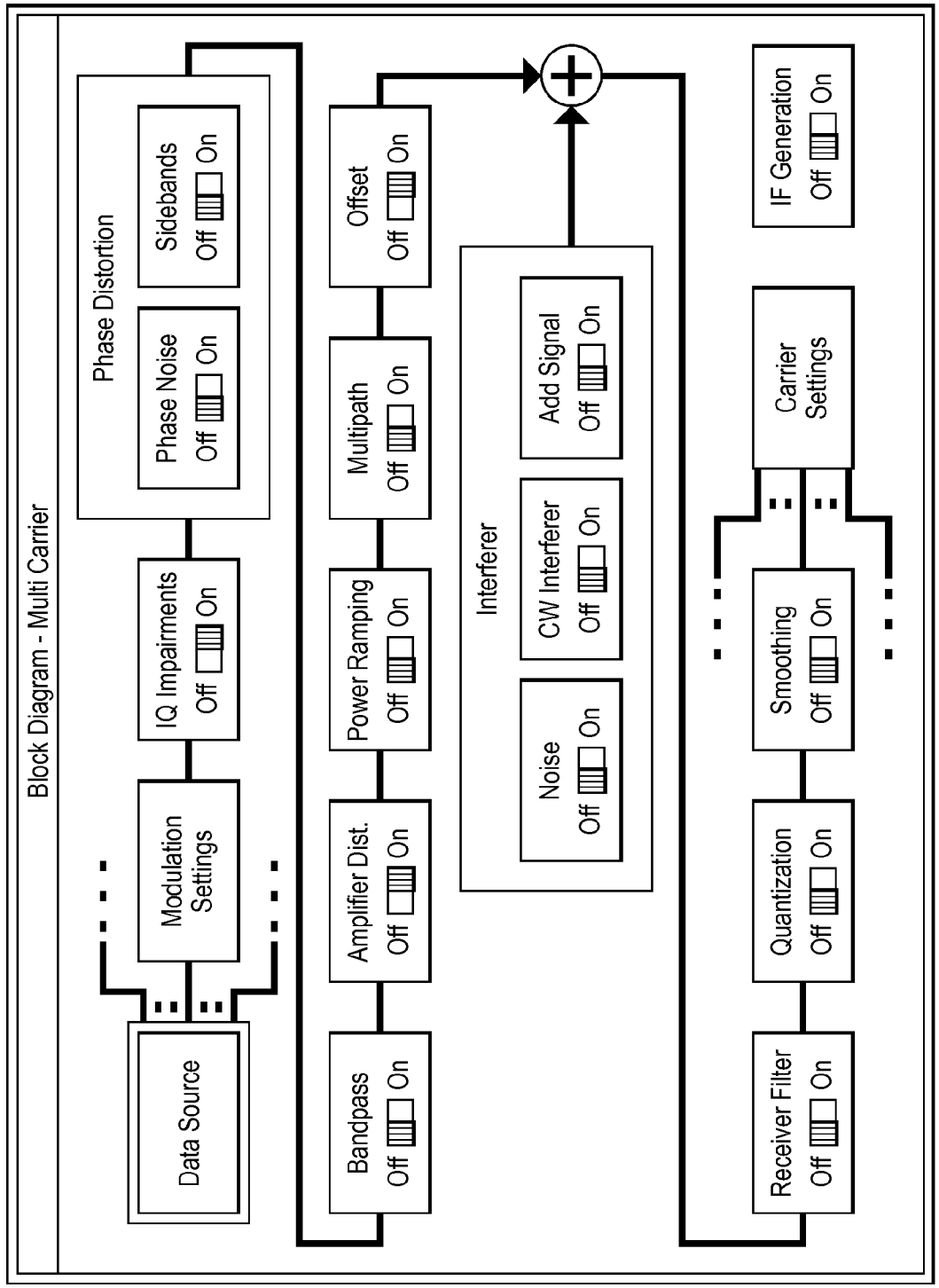
FIG. 1A is a Multi-carrier block diagram of an existing simulation software program for setting-up digitally modulated signals and adding impairments to the signals.
Figure 1B:
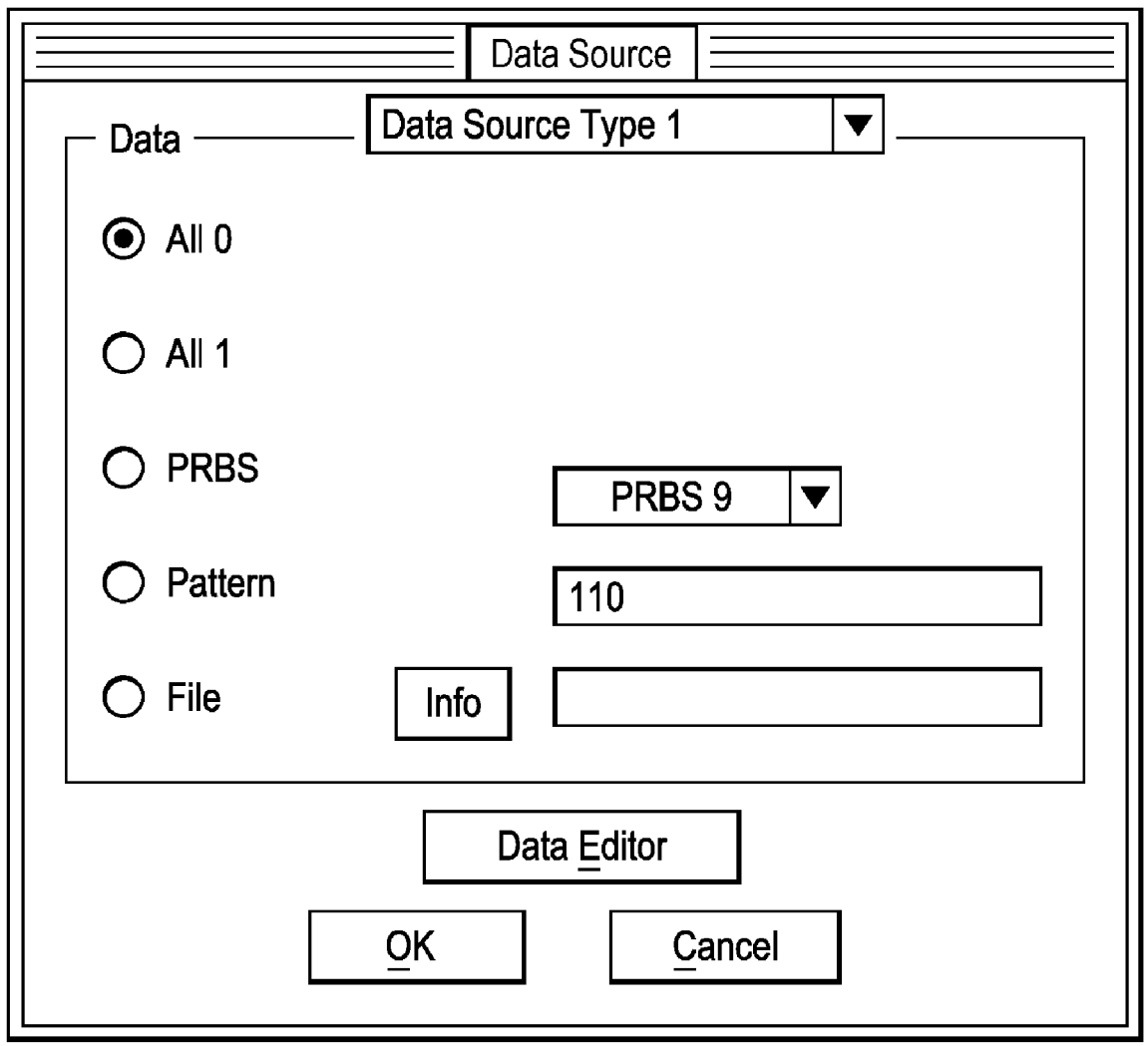
FIG. 1B is a data source dialog window called using the Multi carrier block diagram.
Figure 2A:
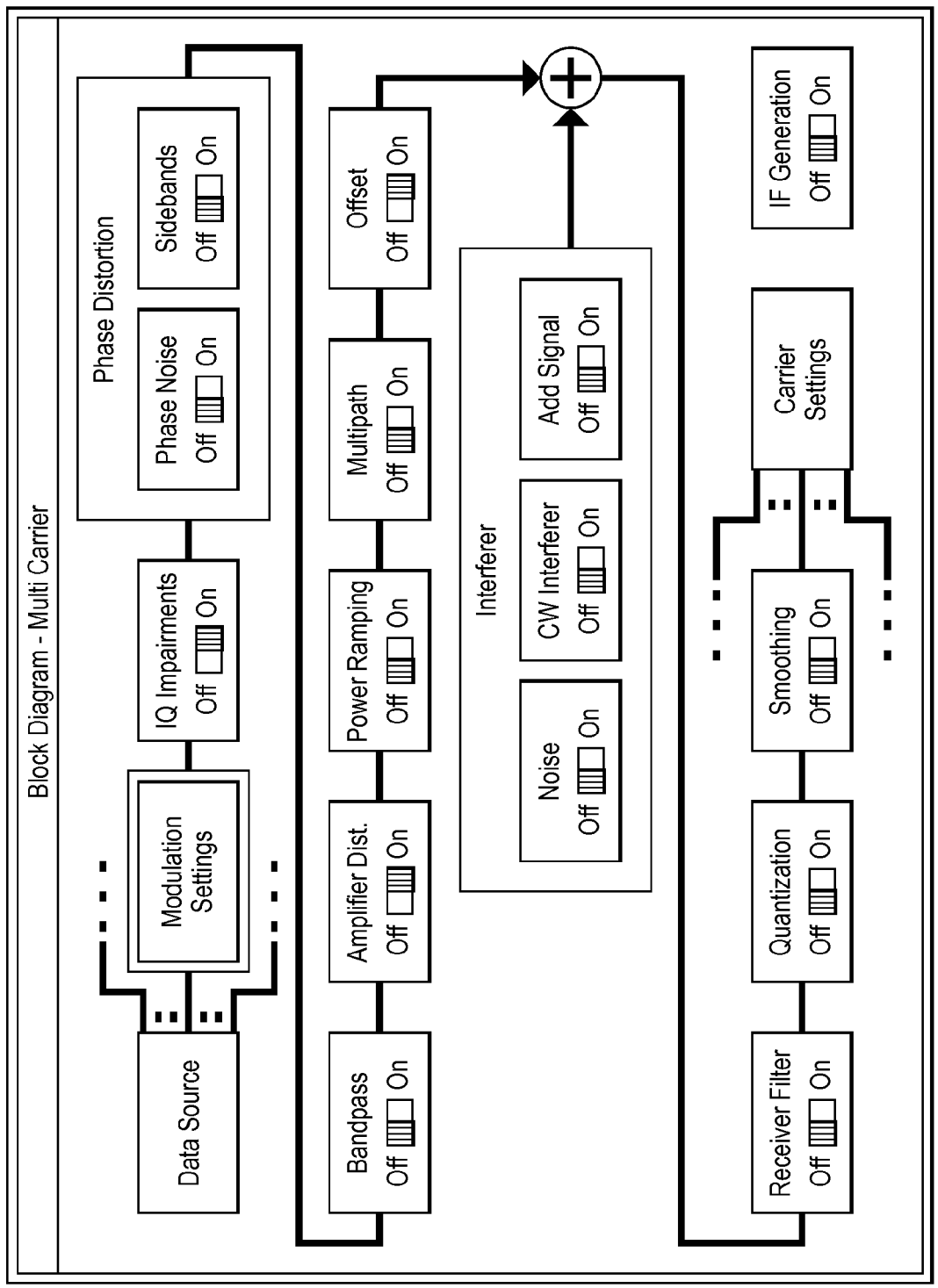
FIG. 2A is the Multi carrier block diagram with Modulation Setting block highlighted.
Figure 3A:
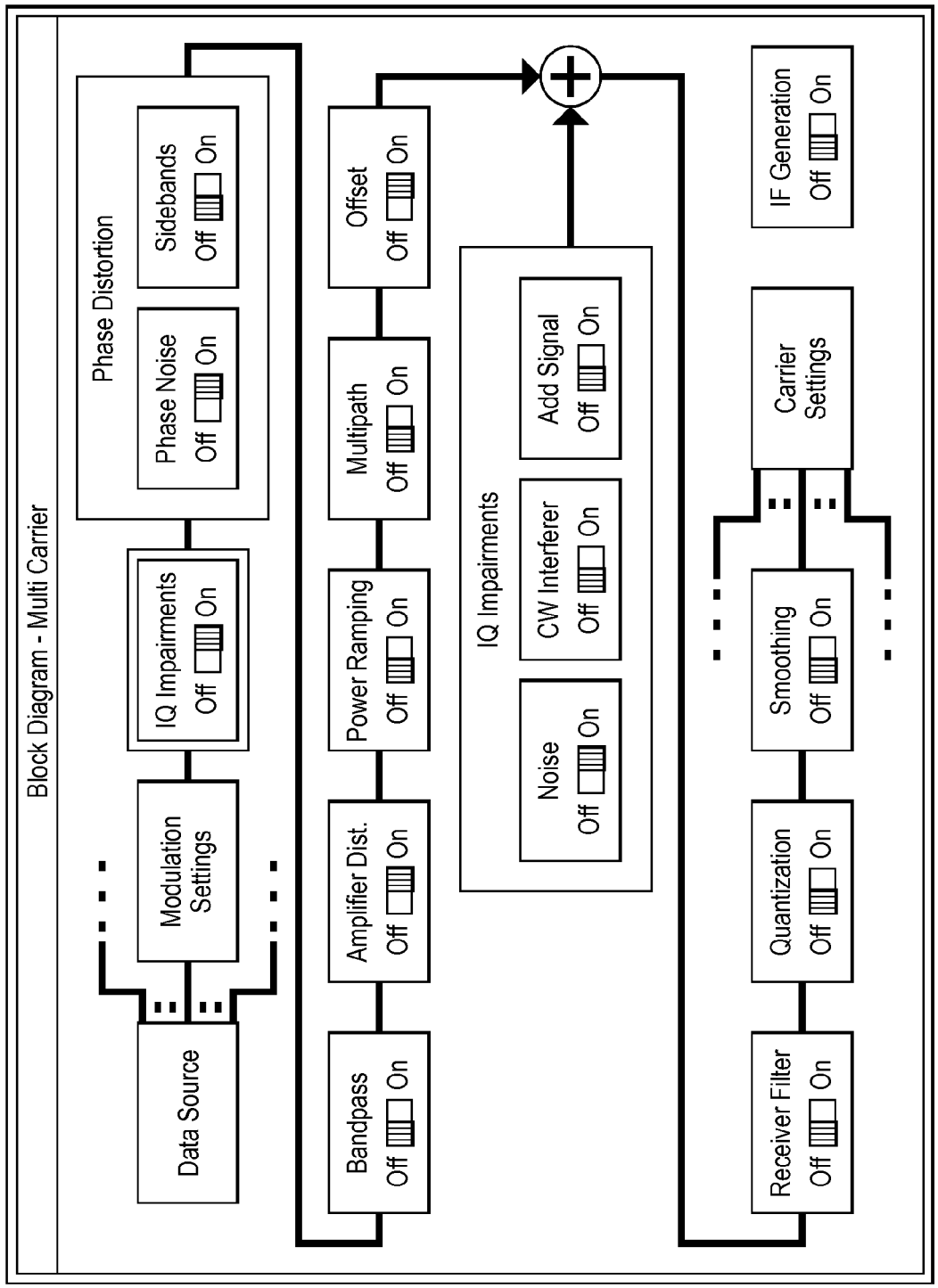
FIG. 3A is the Multi carrier block diagram with IQ Impairments block highlighted.
Figure 4:
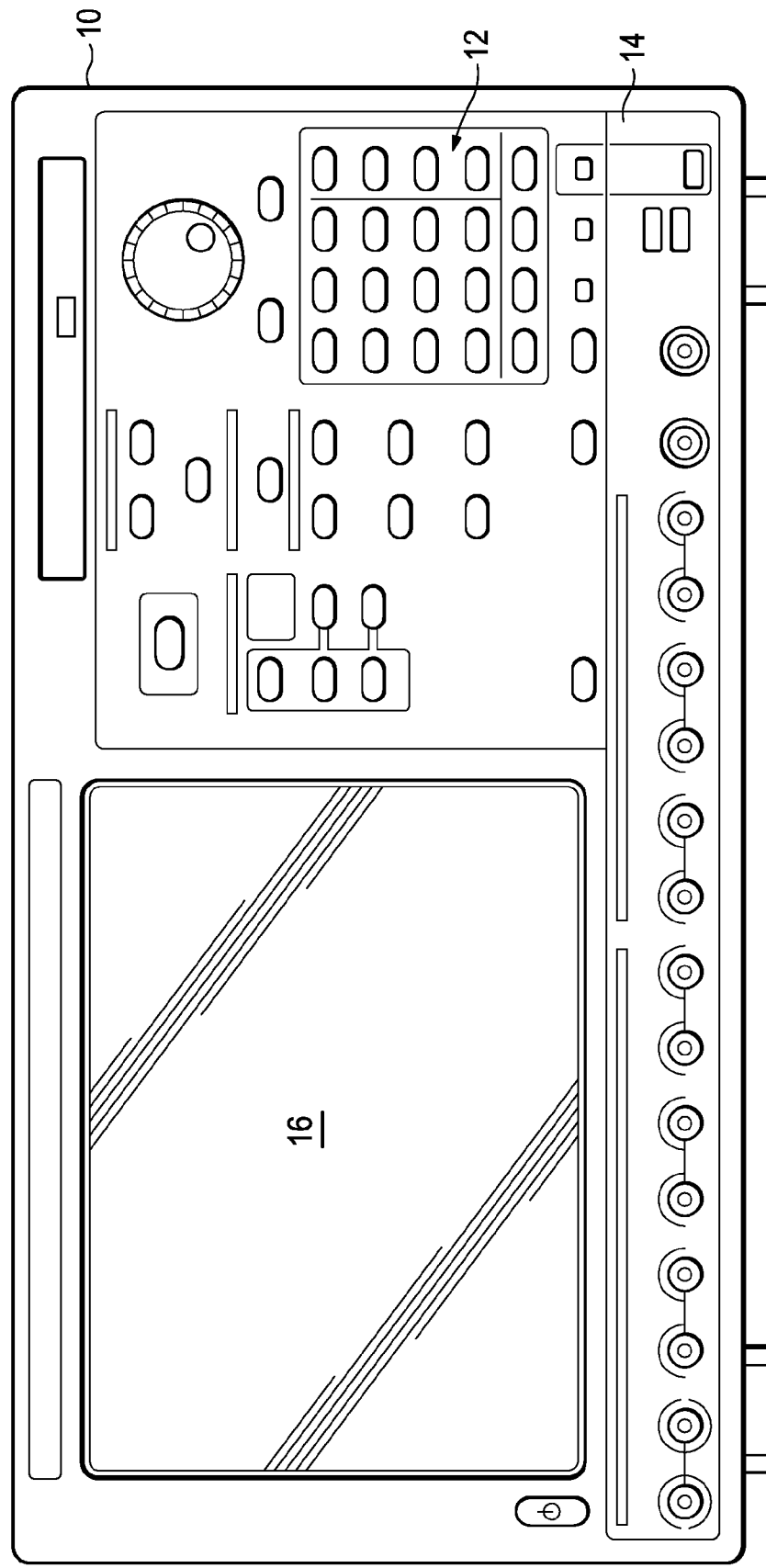
FIG. 4 shows a signal generator having the user interface of the present invention for defining a test signal.

Referring to FIG. 4, there is shown a signal generator 10, such as the AWG7102, manufactured and sold by Tektronix, Inc. Beaverton, Oreg. The signal generator 10 generates signal outputs defined by a user using front panel controls, such as buttons and knobs 12 on the front panel 14 of the signal generator 10 in conjunction with a user interface displayed on a display device 16, such as a liquid crystal display, cathode ray tube or the like. The signal generator 10 also has a CD or DVD/CD drive for storing waveform data, executable programs and the like.

Figure 5:
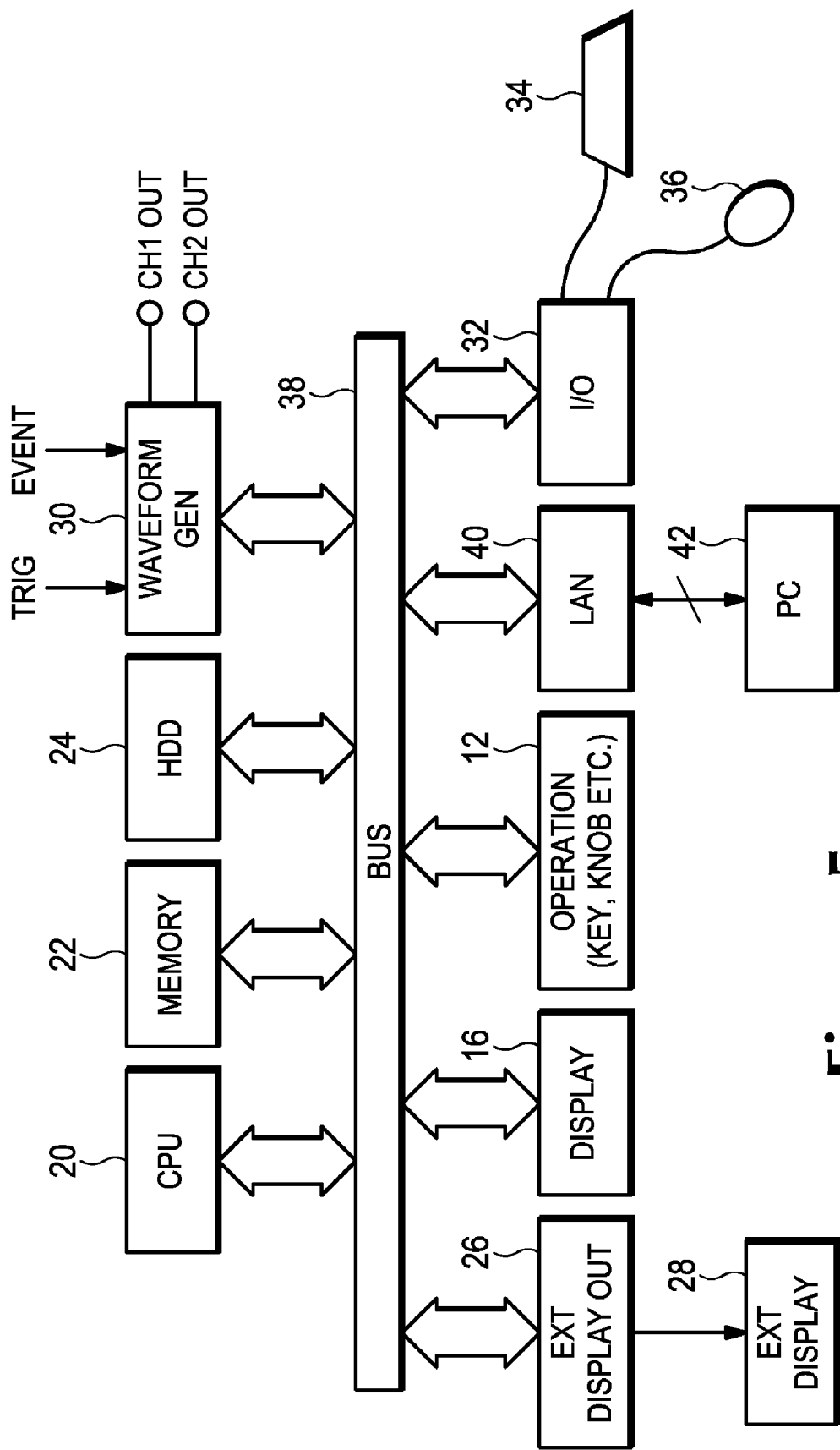
FIG. 5 is a representative block diagram of a signal generator having the user interface of the present invention for defining a test signal.

With reference to FIG. 5, there is shown a representative block diagram of the AWG7102 signal generator 10. The signal generator 10 has a central processing unit (CPU) 20 that controls the operation of the instrument according to programs stored on a hard disk drive (HDD) 24. A memory 22, such as RAM memory, is used for a work area for the CPU 20 to read programs from the storage device 24. A user can set up the signal generator to generate an output test signal via the button, knobs and the like 12 on the front panel 14 of the instrument. The display device 16 provides the user interface for visualizing the information relating to signal patterns and user settings of the output test signal. An external display output circuit 26 provides a video output which may be connected to an external display 28 for providing a larger display area in addition to the built-in display 16 of the signal generator. A waveform generation circuit 30 generates the output test signal based on user defined parameters. In this example, the waveform generator circuit has two channel outputs and inputs for trigger and event signals. An input/output port 32 is used for connecting an external keyboard 34, a pointing device, such as a mouse 36, and the like to the signal generator. The external keyboard 34 and/or mouse 36 may be included as part of the front panel controls of the signal generator. The blocks are coupled together via a signal and data bus 38. The bus 38 of the signal generator may have a Local Area Network (LAN) interface 40 for connecting the signal generator to an external controller, such as a personal computer (PC) 42. The LAN interface 40 allows the user interface to operate on the PC 42 and pass output signal data to the signal generator 10 and also enables the PC 42 to control the signal generator 10 over a network. Alternatively, a General Purpose Interface Bus (GPIB) interface may be used for the LAN interface 40.

Figure 6:
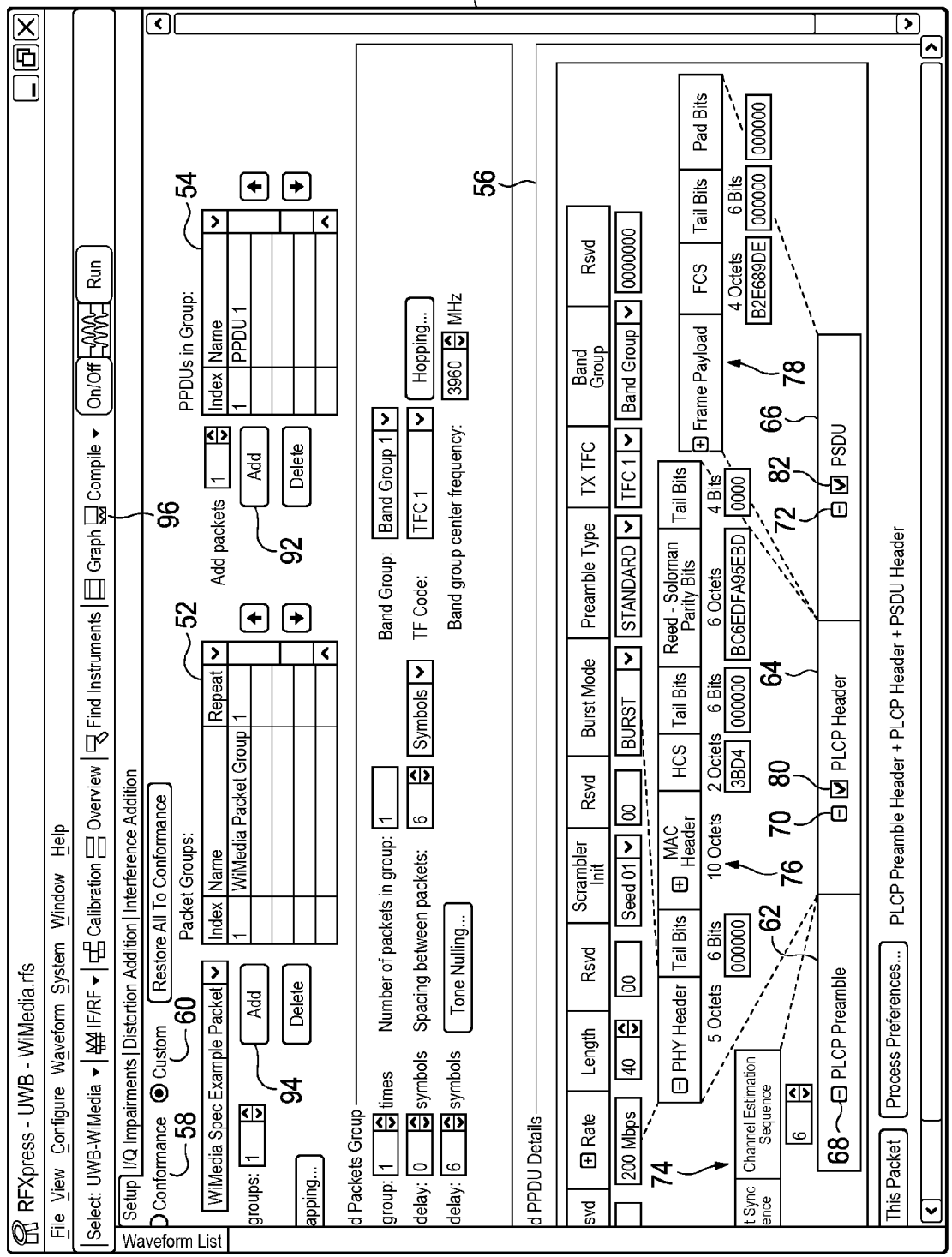
FIG. 6 is display of the user interface of the present invention illustrating various regions of the interface.

Referring to FIG. 6, there is shown the user interface 50 for setting test sequences and parameters of a signal, such as a WiMedia ultra wideband signal as defined by the Multiband WiMedia Alliance. The user interface 50 operates under program control of the CPU 20 with the user interface programs stored on the HDD 24. The user interface 50 may be displayed on the display device 16 or on the external display 28. Alternately, the user interface programs may be stored and accessed by the PC 42. The user interface 50 includes a Packet Group area 52 for defining Packet Groups and a PPDUs in Group area 54 for defining Presentation Protocol Data Units (PPDUs). Associated with each PPDU is a frame structure interface 56 of the WiMedia signal. The frame structure 56 allows the user to define Presentation Protocol Data Units (PPDUs) settings 54 using front panel controls 12 of the signal generator 10 or by using a keyboard 34 and mouse 36 connected to the signal generator 10.

The user interface 50 has two mode radio buttons 58 and 60 for setting the operational modes of the WiMedia ultra wideband signal. One mode is for conformance testing and the other allows the customizing of the parameters of the WiMedia ultra wideband signal. In conformance testing, the parameters of the WiMedia signal are fixed as defined by the standard apart from the pull down options that are provided, such as length, scrambler init, burst mode, preamble type and the like. In the custom mode, the parameters are editable and can be modified by the user.

The frame structure 56 displays PPDU elements as a PLCP Preamble box 62, a PLCP Header box 64 and a PSDU (Physical Layer Service Data Unit) box 66 which are defined in the WiMedia ultra wideband signal standard. Each of the PPDU element box 62, 64, and 66 has a smaller "±" box 68, 70, 72 that may be clicked on to display component boxes associated with each of the PLCP Preamble, PLCP Header and the PSDU as shown by component boxes 74, 76 and 78. The PLCP Header box and the PSDU box each has a further check box 80, 82 that may be clicked on or off. The PLCP Header and/or the PSDU are not provided in the WiMedia ultra wideband signal when their respective check boxes 80, 82 are clicked off. Selected component boxes of the PLCP Preamble, PLCP Header and the PSDU also have "±" boxes which allows the user to display detailed setting items associated with the components. Check boxes, radio buttons, icons, and the like are display elements of test sequences and parameters setting user interface 50.

The user builds a test signal by first selecting between the conformance mode and the custom mode. In either mode, the user defines a PPDUs by assigning a PPDU name in a Name column in a display box of the PPDUs in Group area 54. The Name column has an associated Index column which provides indexes values to the PPDU names. The user then uses the frame structure 56 for setting the parameters for the named PPDU. In the conformance mode, the user is restricted to changing parameters that are provided in the drop down menus associated with curtain of the components and allowed by the WiMedia ultra wideband signal standard. In the custom mode, the parameters may be changed beyond the boundaries of the WiMedia ultra wideband signal standard and/or intentional error data (data impairment) may be provided to the test signal. This allows a test signal to be generated that stresses a device under test receiving the signal to determine the operating limits of the device under test and characterize the design of the device under test to secure the operational stability.

Figure 7:
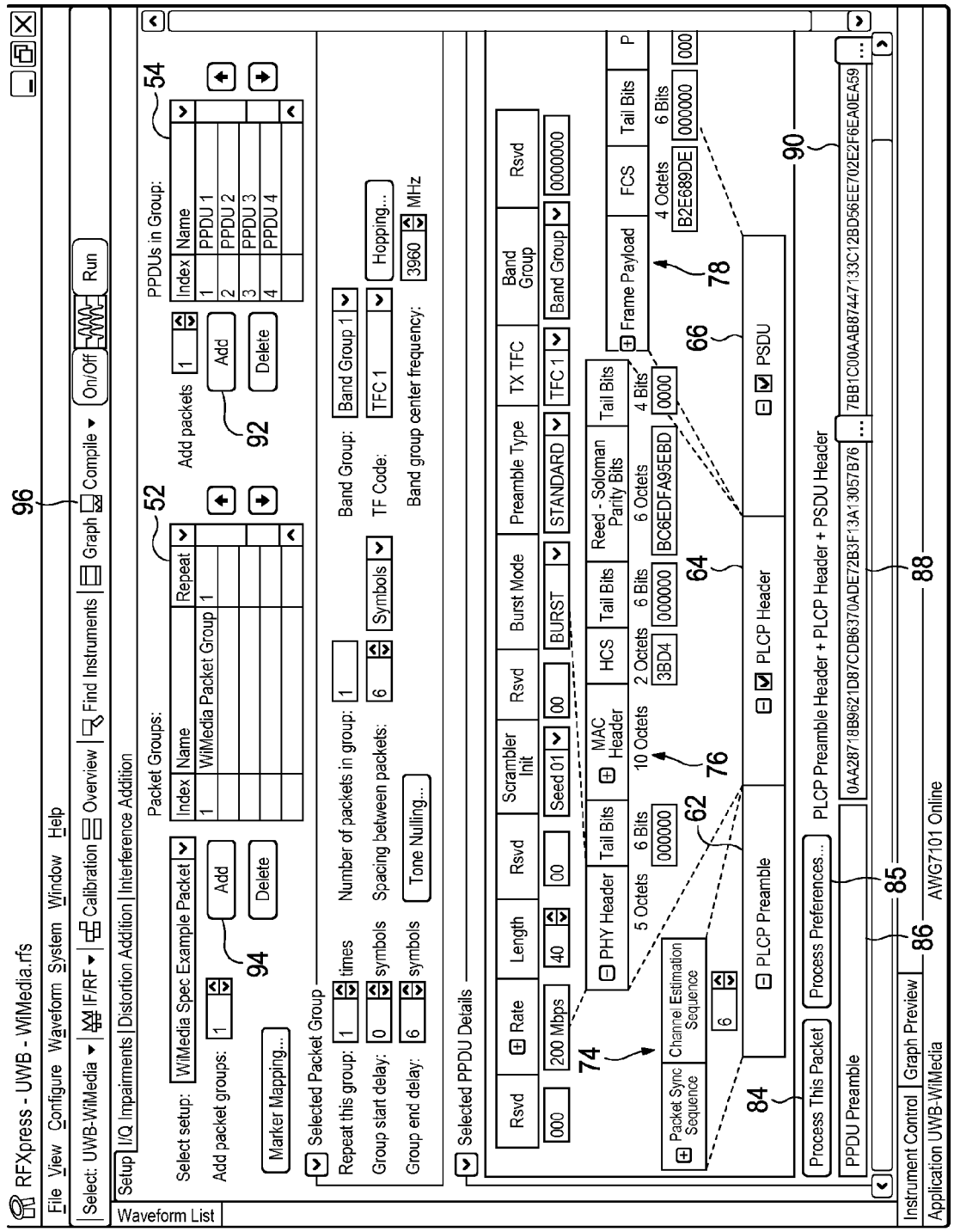
FIG. 7 is a display of the user interface of the present invention illustrating the generation of PPDUs in a group.

Assuming the user interface is set for the custom mode, the user can individually click on the "±" boxes 68, 70, 72 in the PLCP Preamble box 62, the PLCP Header box 64 and a PSDU box 66 to display the respective components boxes 74, 76 and 78 of the Preamble, Header and PSDU. When a "–" symbol appears in one of the "±" boxes 68, 70, 72, the associated components boxes 74, 76 and 78 of the Preamble, Header and the PSDU are displayed. When a "+" symbol appears in one of the "±" boxes 68, 70, 72, the associated component boxes 74, 76, 78 are not displayed. Associated with each of the component boxes are either drop down menus or data boxes which the user may select or enter values. Some of the component boxes 74, 76 and 78 also have "±" boxes, such as the Packet Sync Sequence box in the Preamble component boxes 74, the PHY Header box and MAC Header box in the PLCP Header component boxes 76 and the Frame Payload box in the PSDU component box icons 78. Clicking on the "±" boxes in the component box icons display detailed setting items of the components, such as the shown by the "–" in the "±" box associated with the PHY Header component. The PHY header detailed setting items further have drop down menus and data boxes which the user may select or input values. A Process This Packet icon 84 is provided, as shown in FIG. 7, at the bottom of the user interface 50 for processing the entered data and parameters for each of the PLCP Preamble, PLCP Header and PSDU in the PPDU into hexadecimal codes. At this time, checking codes such as HCS, etc. are automatically generated. If the user wants to maintain the intentional modification via the user interface rather than the auto-generation, "Process Preferences" 85 provides an option to select whether the auto-generabon is applied or not. The hexadecimal codes are displayed in boxes 86, 88 and 90 under the PLCP Preamble box icon 62, the PLCP Header box icon 64 and the PSDU box icon 66.

Once the user has set the parameters for the currently defined PPDU, the user can add a new PPDU to the PPDUs in Group area 54 by clicking the add button 92 associated with the PPDUs in Group area 54 are and assign a new PPDU name. The user then uses the frame structure 56 to set the parameters for the new PPDU. The user can define and set the parameters for any number of PPDUs by assigning new PPDU names for each of the PPDU as representatively shown by PPDU 1 through PPDU 4 in PPDUs in Group area 54 in FIG. 7.

The PPDUs are grouped into Packet Groups using the Packet Group area 52. The Packet Group area 52 has a display box that includes an Index column, a Name column, and a Repeat column. The user assigns a name to the Packet Group and set the number of times the Packet Group is to repeat. An index value is assigned to each Packet Group. An add button 94 associated with the Packet Group 52 allows a user to add new Packet Groups. The ability to associate multiple PPDUs with a Packet Group, define multiple Packet Groups and repeat the Packet Groups multiple times allows the user to develop a complex test signal for stressing a device under test.

The completed test signal is compiled by clicking on the compile icon 96 at the top of the user interface 50. The user interface program compiles the parameters and data for the test signal into digital values that are stored in the memory 22 of the signal generator 10. The waveform generation circuit 30 in the signal generator 10 receives the stored digital data representing the test signal and generates signal patterns based on user defined parameters and values set using the user interface 50.

While the above user interface 50 has been described in relation to a WiMedia ultra wideband signal, the present invention may also be incorporated for use with other signal standards, such as 802.11n, 802.15.3c, WiFi, WIMAX, and WIHD standards.

The foregoing description of the invention has been described for the purposes of clarity and understanding. It is not intended to limit the invention to the precise form disclosed.

What is claimed is:

1. A method of setting test sequences and parameters of a test signal comprising the steps of:
   a) defining a Packet Group;
   b) defining an indexed Presentation Protocol Data Unit;
   c) inputting and processing parameters for said indexed Presentation Protocol Data Unit;
   d) associating said processed indexed Presentation Protocol Data Unit with said Packet Group;
   e) compiling said Packet Group associated with said indexed processed Presentation Protocol Data Unit to generate digital data representative of said test signal; and
   f) generating a test signal output defined by said parameters in said indexed Presentation Protocol Data Unit associated with said Packet Group.

2. The method of setting test sequences and parameters of a test signal as recited in claim 1 where the step of defining a Packet Group further comprises the step of setting a number to repeat said Packet Group.

3. The method of setting test sequences and parameters of a test signal as recited in claim 1 wherein the inputting step further comprises the steps of:
   a) selecting at least a first Presentation Protocol Data Unit element in said Presentation Protocol Data Unit;
   b) selecting a component within said selected Presentation Protocol Data Unit element; and
   c) inputting parameters for detailed setting items in said selected component within said selected Presentation Protocol Data Unit element.

4. The method of setting test sequences and parameters of a test signal as recited in claim 3 further comprising the steps of:
   a) repeating steps b), c) and d) for additional indexed Presentation Protocol Data Units;
   b) repeating steps a), b), c) and d) for additional Packet Groups;
   c) compiling said Packet Groups associated with said processed indexed Presentation Protocol Data Units to generate digital data representative of said test signal; and
   d) generating a test signal output defined by said parameters in said indexed Presentation Protocol Data Units associated with said Packet Groups.

5. The method of setting test sequences and parameters of a test signal as recited in claim 1 further comprising an initial step of selecting a conformance operational mode or a custom operational mode.

6. A method of setting test sequences and parameters of a test signal comprising the steps of:
   a) defining a Packet Group;
   b) defining an indexed Presentation Protocol Data Unit;
   c) inputting and processing parameters for said indexed Presentation Protocol Data Unit;
   d) associating said processed indexed Presentation Protocol Data Unit with said Packet Group;
   e) repeating steps b), c) and d) for additional indexed Presentation Protocol Data Unit; and
   f) repeating steps a), b), c) and d) for additional Packet Groups.

7. The method of setting test sequences and parameters of a test signal as recited in claim 6 where the step of defining a Packet Group further comprises the step of setting a number to repeat said Packet Groups.

8. The method of setting test sequences and parameters of a test signal as recited in claim 6 further comprising the step of compiling said Packet Groups to generate digital data representative of said test signal.

9. The method of setting test sequences and parameters of a test signal as recited in claim 8 wherein the digital data generating step further comprises the step of generating a test signal output defined by said parameters in each said indexed Presentation Protocol Data Unit associated with each said Packet Group.

10. The method of setting test sequences and parameters of a test signal as recited in claim 6 wherein the inputting step further comprises the steps of:
    a) selecting at least a first Presentation Protocol Data Unit element in said Presentation Protocol Data Unit;
    b) selecting a component within selected Presentation Protocol Data Unit element; and
    c) inputting parameters for detailed setting items in said selected component within selected Presentation Protocol Data Unit element.

11. The method of setting test sequences and parameters of a test signal as recited in claim 6 further comprising an initial step of selecting a conformance operational mode or a custom operational mode.

12. A signal generator for setting test sequences and parameters of a test signal comprising:
    a user interface for selecting parameters in at least a first Presentation Protocol Data Unit associated with at least a first Packet Group for said test signal;

a signal processing unit compiling at least said first Packet Group containing at least said Presentation Protocol Data Unit to generate digital data representative of the test signal with at least first Packet Group containing at least said Presentation Protocol Data Unit; and a waveform generator receiving the digital data and generating a test signal output having at least first Packet Group containing at least said Presentation Protocol Data Unit.

13. The signal generator as recited in claim 12 further comprising a memory storing the compiled digital data representative of the test signal with at least first Packet Group containing at least said Presentation Protocol Data Unit.

14. The signal generator as recited in claim 12 wherein the user interface further comprises selectable radio buttons, check boxes and icons display elements.

* * * * *